US009000856B1

(12) United States Patent
Pancholi et al.

(10) Patent No.: US 9,000,856 B1
(45) Date of Patent: Apr. 7, 2015

(54) SYSTEM AND METHOD FOR PROCESS AND TEMPERATURE CALIBRATION OF CAPACITOR-BASED OSCILLATORS

(71) Applicant: SanDisk Technologies Inc., Plano, TX (US)

(72) Inventors: Deepak Pancholi, Bangalore (IN); Bhavin Odedara, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/329,203

(22) Filed: Jul. 11, 2014

(30) Foreign Application Priority Data

May 23, 2014 (IN) .......................... 1730/MUM/2014

(51) Int. Cl.
*H03L 1/02* (2006.01)
*H03B 5/12* (2006.01)
*H03L 1/04* (2006.01)

(52) U.S. Cl.
CPC ................ *H03L 1/04* (2013.01); *H03B 5/1206* (2013.01)

(58) Field of Classification Search
CPC ............. H03L 1/00; H03L 1/02; H03L 1/022; H03L 1/026; H03B 5/04
USPC ............. 331/176, 70, 44, 117 R, 117 FE, 167
See application file for complete search history.

(56) References Cited

U.S. PATENT DOCUMENTS

| 8,187,936 B2 | 5/2012 | Alsmeier et al. | |
| 2003/0058057 A1* | 3/2003 | Schmidt ........................ | 331/176 |
| 2007/0176705 A1* | 8/2007 | Sutardja ........................ | 331/176 |
| 2011/0181367 A1* | 7/2011 | Satoh et al. ..................... | 331/34 |
| 2013/0321048 A1* | 12/2013 | He ................................ | 327/156 |

OTHER PUBLICATIONS

Application as Filed for U.S. Appl. No. 14/133,979, filed Dec. 19, 2013, 121 pages.
Application as Filed for U.S. Appl. No. 14/136,103, filed Dec. 20, 2013, 56 pages.
Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.
Arya, P., "A Survey of 3D Nand Flash Memory", *EECS Int'l Graduate Program, National Chiao Tung University*, 2012, pp. 1-11.
Nowak, E. et al., "Intrinsic Fluctuations in Vertical NAND Flash Memories", *2012 Symposium on VLSI Technology Digest of Technical Papers*, 2012, pp. 21-22.

* cited by examiner

*Primary Examiner* — Ryan Johnson
(74) *Attorney, Agent, or Firm* — Brinks Gilson & Lione

(57) ABSTRACT

A method and device for calibrating an oscillator and a temperature sensor in an electronic device are provided. A same temperature cycle, which includes at least two distinct temperatures, may be used to obtain data to calibrate both the oscillator and the temperature sensor. One of the distinct temperatures may comprise an ambient temperature, and a second distinct temperature may comprise a heated temperature greater than the ambient temperature. The electronic device (or a calibration device separate from the electronic device) may receive the readings from the oscillator and the temperature sensor at the two distinct temperatures in the same temperature cycle, and may determine an oscillator correction factor and a temperature sensor correction factor.

22 Claims, 10 Drawing Sheets

SYSTEM AND METHOD FOR PROCESS AND TEMPERATURE CALIBRATION OF CAPACITOR-BASED OSCILLATORS

REFERENCE TO RELATED APPLICATION

This application claims the benefit of Indian Patent Application No. 1730/MUM/2014, filed on May 23, 2014, the entirety of which is incorporated by reference herein.

TECHNICAL FIELD

This application relates generally to capacitor-based oscillators. More specifically, this application relates to calibration of an electronic device including a temperature sensor and a capacitor-based oscillator.

BACKGROUND

Electronic devices typically operate based on precise frequencies. The precise frequencies may be used to provide a stable clock signal for integrated circuits, or may be used to stabilize frequencies for radio transmitters and receivers. One way to generate a precise frequency is by using a crystal oscillator. The crystal oscillator is an electronic oscillator circuit that uses the mechanical resonance of a vibrating crystal to create an electrical signal with the precise frequency.

However, crystal oscillators may prove too expensive for certain electronic devices. For example, USB peripheral electronic devices may be more cost-sensitive, with the crystal oscillators adding too much cost to the bill of materials. In this regard, electronic devices may generate the frequency without using a crystal, such as by using an L-C oscillator, R-C oscillator or the like.

BRIEF SUMMARY

A method and device for calibrating an oscillator and a temperature sensor in an electronic device are provided. In one aspect, a method for obtaining temperature sensor output from a temperature sensor and oscillator output from an oscillator in a same temperature cycle in order to calibrate the temperature sensor and the oscillator in an electronic device is provided. The method comprises: sending a command in order to configure the oscillator to a predetermined frequency; determining a first temperature of the electronic device; while the electronic device is at the first temperature in the same temperature cycle, receiving a first output of the temperature sensor indicative of the temperature sensor sensing the electronic device at the first temperature, and sensing a first output of the oscillator indicative of the oscillator generating a first frequency output at the first temperature; controlling temperature of the electronic device so that the electronic device is at a second temperature in the same temperature cycle, the second temperature distinct from the first temperature; while the temperature of the electronic device is being controlled at the second temperature in the same temperature cycle, receiving a second output of the temperature sensor indicative of the temperature sensor sensing the electronic device at the second temperature, and sensing a second output of the oscillator indicative of the oscillator generating a second frequency output at the second temperature; determining a temperature sensor correction factor based on the first output of the temperature sensor, the second output of the temperature sensor, the determined first temperature and the determined second temperature; and determining an oscillator correction factor based on the first output of the oscillator, the second output of the oscillator, the determined first temperature, the determined second temperature and the predetermined frequency.

The method may be performed by the electronic device, by a calibration device external to the electronic device, or using a combination of the electronic device and the calibration device. For example, the calibration device may send the command to the electronic device in order to configure the oscillator to a predetermined frequency. Alternatively, the electronic device may send the command to the oscillator in order to configure the oscillator to the predetermined frequency. As another example, the calibration device may determine the temperature sensor correction factor and the oscillator correction factor, and then send the temperature sensor correction factor and the oscillator correction factor to the electronic device for storage (and later use). Alternatively, the electronic device may determine the temperature sensor correction factor and the oscillator correction factor, and then store the temperature sensor correction factor and the oscillator correction factor for later use.

Further, the temperature sensor correction factor may comprise an equation, such as a line, or may comprise a set of data points. Likewise, the oscillator correction factor may comprise an equation, such as a line, or may comprise a set of data points. In order to determine the temperature sensor correction factor and the oscillator correction factor, a single temperature cycle with two distinct temperatures may be used. One distinct temperature may be ambient temperature and the second distinct temperature may be a temperature different from ambient temperature (such as using a heater in order to generate a temperature greater than ambient temperature). Alternatively, the two distinct temperatures may be greater than ambient temperature.

The first temperature of the electronic device may be determined in one of several ways. One way is to use a temperature sensor separate from the temperature sensor being calibrated (e.g., a temperature sensor on the calibration device). Another way is to receive feedback from the heater to determine the current temperature of the electronic device.

In another aspect, an electronic device configured to calibrate a oscillator is provided. a device configured to obtain temperature sensor output from a temperature sensor and oscillator output from an oscillator in a same temperature cycle in order to calibrate the temperature sensor and the oscillator in an electronic device is provided. The device includes: an interface configured to communicate with the oscillator and the temperature sensor; and a controller in communication with the interface. The controller is configured to: send a command in order to configure the oscillator to a predetermined frequency; determine a first temperature of the electronic device; while the electronic device is at the first temperature in the same temperature cycle: receive a first output of the temperature sensor indicative of the temperature sensor sensing the electronic device at the first temperature, and sense a first output of the oscillator indicative of the oscillator generating a first frequency output at the first temperature; control temperature of the electronic device so that the electronic device is at a second temperature in the same temperature cycle, the second temperature distinct from the first temperature; while the temperature of the electronic device is being controlled at the second temperature in the same temperature cycle: receive a second output of the temperature sensor indicative of the temperature sensor sensing the electronic device at the second temperature, and sense a second output of the oscillator indicative of the oscillator generating a second frequency output at the second temperature; determine a temperature sensor correction factor based on the first output of the temperature sensor, the second output of the temperature sensor, the determined first temperature and the determined second temperature; and determine an oscillator correction factor based on the first output of the oscillator, the second output of the oscillator, the determined first temperature, the determined second temperature and the predetermined frequency.

The device may comprise the electronic device, may comprise a calibration device external to the electronic device, or may comprise a combination of the electronic device and the calibration device.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1A:
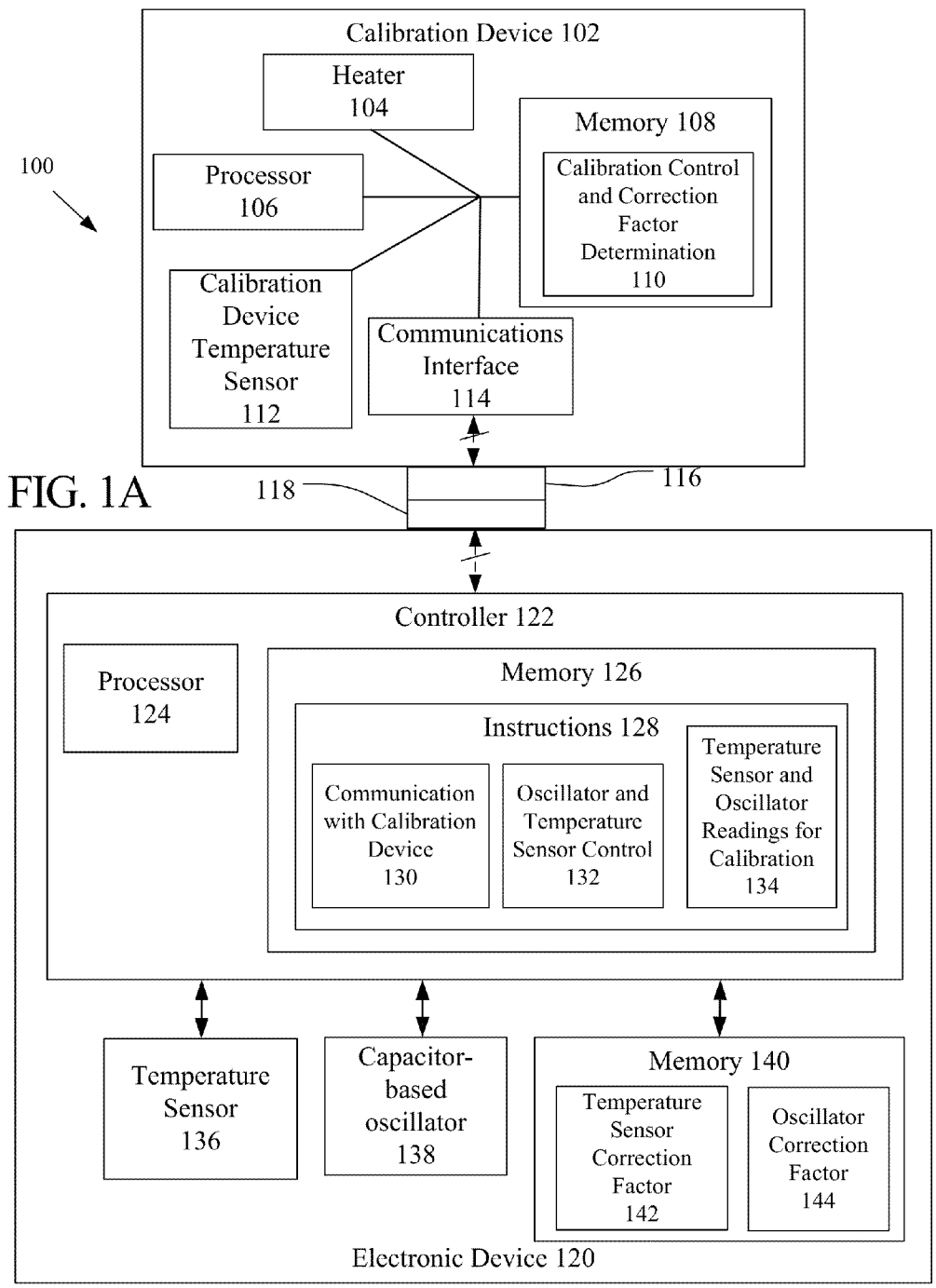
FIG. 1A illustrates a first example of a system for calibrating the temperature sensor and the oscillator in an electronic device.

An electronic device may operate using one or more precise frequencies. One way to generate the precise frequency is by using an oscillator, such as a capacitor-based oscillator. As discussed in more detail below, the capacitor-based oscillator may comprise, for example, an inductor-capacitor (LC) oscillator or a resistor-capacitor (RC) oscillator. More specifically, the RC oscillator is configured to generate an oscillating signal without using a crystal.

However, the frequency output by the oscillator, such as the capacitor-based oscillator, may be dependent on various factors, including, without limitation, any one, any two, or all of the following: process, voltage, and/or temperature. For example, for different types of oscillators, such as an LC oscillator or an RC oscillator, the output frequency may vary with process or with silicon die-to-die, and/or may vary based on the temperature of the oscillator. In this regard, calibration of the capacitor-based oscillator may be performed.

Further, the electronic device may include a temperature sensor. Similar to the oscillator, the output of the temperature sensor may be dependent on the process of constructing the sensor. In this regard, calibration of the temperature sensor may be performed.

In one embodiment, calibration of both the temperature sensor and the oscillator on the electronic device may be performed during a same temperature cycle. More specifically, the environment of the electronic device may be changed such that the electronic device is at at least two distinct temperatures. As one example, the first temperature of the electronic device may be at room temperature (e.g., ~27° C.), and the second temperature may be at a temperature different from room temperature (such as at 90° C.). To achieve the second temperature, the electronic device may be heated by an external heater. As another example, the electronic device may be heated to a first temperature (e.g., 50° C.), and then the electronic device may be heated to a second temperature such as at 90° C.). As discussed in more detail below, the actual temperature of the electronic device may be determined in one of several ways, such as by using a temperature sensor separate and distinct from the temperature sensor subject to calibration. Regardless, the temperature of the electronic device is at two (or more) distinct temperatures.

When the electronic device is at each of the two distinct temperatures in the same temperature cycle, the outputs of both of the temperature sensor and the oscillator may be sensed to determine, respectively, the measured temperature according to the temperature sensor and to determine the frequency output from the oscillator. For example, when the temperature is determined to be at 27° C., the output of the temperature sensor may be sensed. Likewise, the output of the oscillator, configured to a predetermined frequency setting, may be analyzed (such as counting edges of the clock cycle) to determine the frequency output, and compared with the predetermined frequency setting. The measurements of the temperature sensor output and the oscillator output may be performed again at a different temperature, such as 90°.

Based on the measurements, a temperature sensor correction factor and an oscillator correction factor may be generated. In one embodiment, the temperature sensor correction factor may be represented by a line, with a slope m and a y-intersect B. Likewise, the oscillator correction factor may be represented by a line.

For notation purposes, the slope for the temperature sensor correction factor may be represented by $m_{TS}$ and the y-intersect may be represented by $B_{TS}$. In equation form, the line for the temperature sensor correction factor is represented by:

$$y_{TS}=M_{TS}*X_{TS}+B_{TS},$$

where $y_{TS}$ is the adjusted temperature output and $X_{TS}$ is the output generated by the temperature sensor.

Similarly, the slope for the oscillator correction factor may be represented by $m_{OSC}$ and the y-intersect may be represented by $B_{OSC}$. In equation form, the line for the oscillator correction factor is represented by:

$$y_{OSC}=m_{OSC}*X_{OSC}+B_{OSC},$$

The temperature sensor correction factor and the oscillator correction factor may be stored in a part of the electronic device, such as in an E-fuse or the like. When the electronic device seeks a current temperature of the electronic device, the electronic device may receive the temperature sensor output, access the stored temperature sensor correction factor, and apply the stored temperature sensor correction factor to the temperature sensor output in order to generate an adjusted temperature sensor output. Likewise, the electronic device may wish to control the oscillator to generate a predetermined frequency output. As discussed above, the oscillator output may depend on different variables, such as process and temperature. Thus, the oscillator correction factor may be used to determine the frequency output of the oscillator based on the current temperature.

Figure 1B:
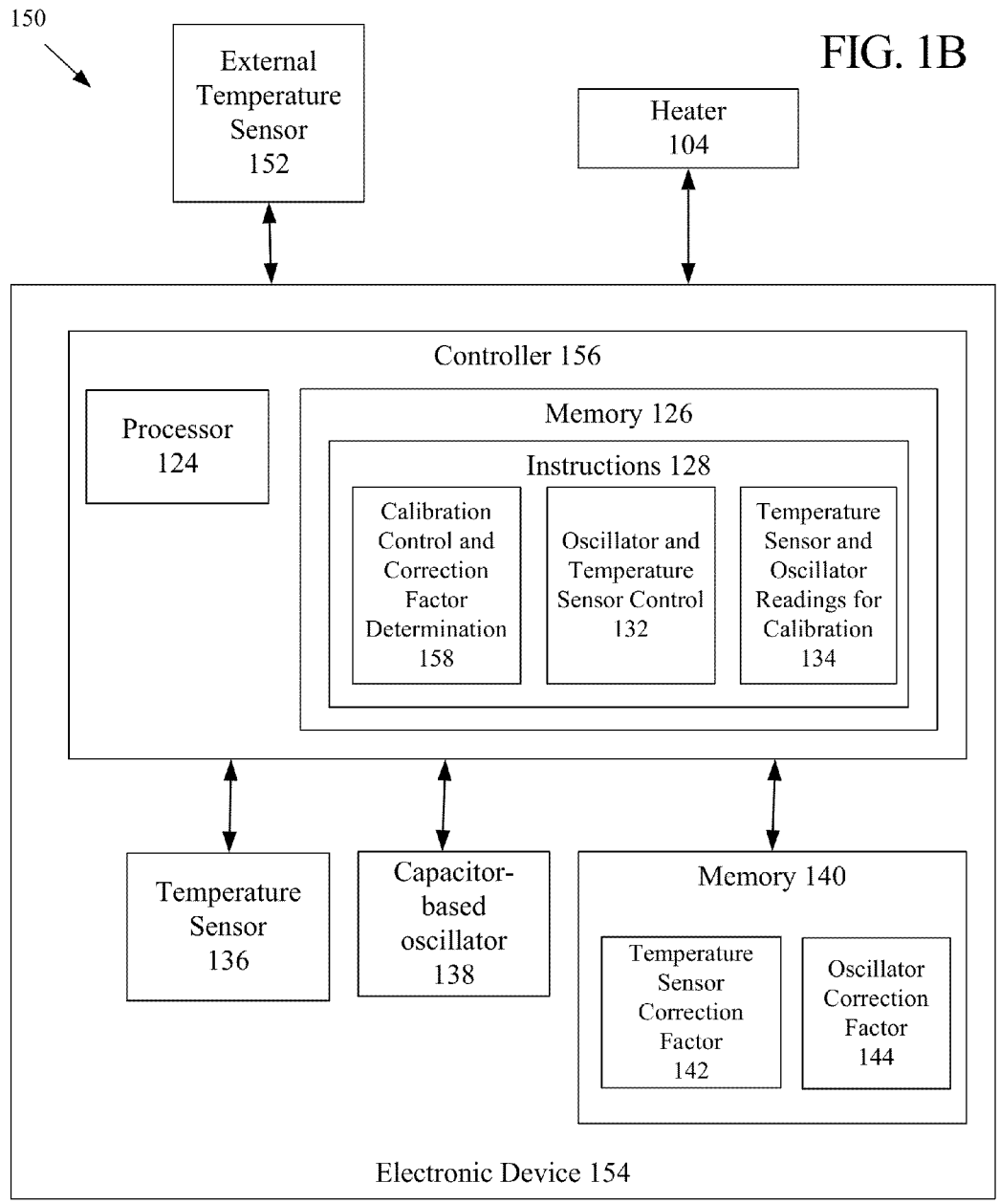
FIG. 1B illustrates a second example of a system for calibrating the temperature sensor and the oscillator in an electronic device.
Figure 1C:
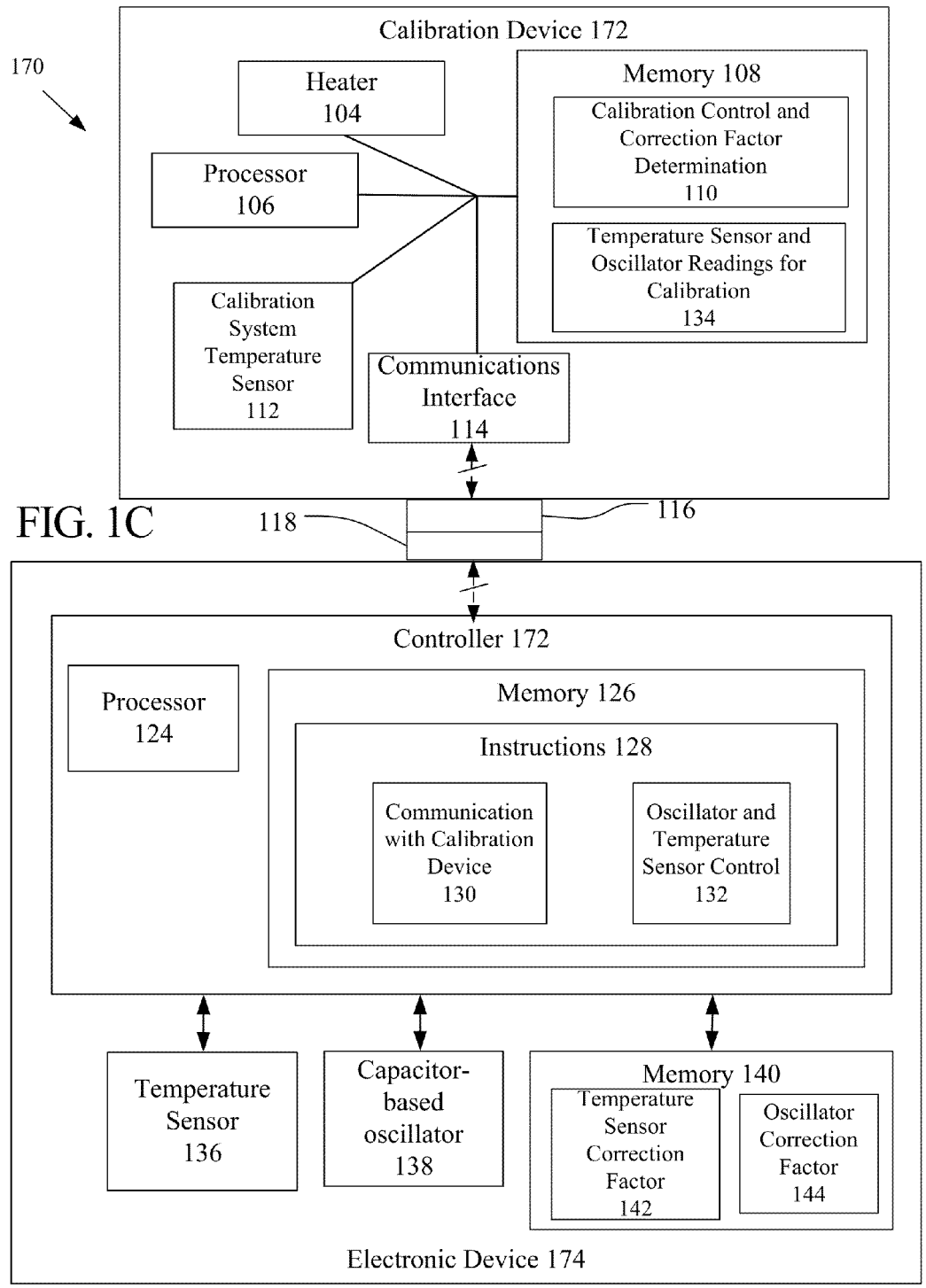
FIG. 1C illustrates a third example of a system for calibrating the temperature sensor and the oscillator in an electronic device.

The temperature sensor and the oscillator may be calibrated in one of several ways. One way, as depicted in FIG. 1A, is for the electronic device to control execution of the calibration routine, working in combination with a calibration device (which houses a heater). Another way, as depicted in FIG. 1B, is for the electronic device to control execution of the calibration routine, by working in combination with a heater. Still another way, as depicted in FIG. 1C, is for an external device to control execution of the calibration routine, working in combination with the electronic device. The disclosed ways to calibrate the temperature sensor and the oscillator are merely for illustration purposes. Other ways are contemplated. In this regard, the function of calibrating the temperature sensor and the oscillator may be performed in a single device (such as solely in the electronic device), or may be performed amongst multiple devices (such as a calibration device and the electronic device), as discussed below.

FIG. 1A illustrates a first example of a system 100 for calibrating the temperature sensor 136 and the oscillator 138 in an electronic device 120. As discussed above, various oscillators are contemplated, such as a capacitor-based oscillator as illustrated in FIG. 1A. The system 100 includes a calibration device 102 that works in combination with the electronic device 120 to calibrate the temperature sensor 138 and the oscillator 136. The calibration device 102 includes a heater 104, a processor 106, a memory, a calibration device temperature sensor 112, and a communications interface 114.

The processor 106 may include one or more general processors, controllers, application specific integrated circuits, field programmable gate arrays, digital circuits, optical circuits, analog circuits, combinations thereof, or other now known or later-developed devices for analyzing and processing data. The memory 108 may comprise volatile and/or non-volatile memory for storing data and/or instructions for execution by the processor 102. One example of instructions stored in memory 108 is calibration control and correction factor determination instructions 110.

The heater 104 may comprise any type of heater, such as a hot-air blower, radiator, convector, or the like. Execution by processor 106 of calibration control and correction factor determination instructions 110 enables the processor 106 to send a command to the electronic device to configure the oscillator at a predetermined frequency and to control heater 104 and to calculate the correction factors, as discussed in more detail below. More specifically, the processor 106 may send a command to the electronic device 120, the command indicative to the electronic device to configure the oscillator 138 to a predetermined setting (such as 10_000, discussed below) for calibration. Further, the processor 106 may send commands to heater 104 in order for the temperature of the electronic device 120 to be configured in order to calibrate the temperature sensor 136 and oscillator 138, and responsive to receipt of temperature sensor outputs and frequency determinations, calculate the correction factors.

In one embodiment, the processor 106 may further be configured to control the oscillator 138 to step through various settings in order to determine the setting of the oscillator that generates an output of a predetermined frequency. As discussed in more detail below, a second correction factor may be used. In one embodiment, the second correction factor may be based on the setting of the oscillator at a predetermined temperature (such as 27° C.) that generates a predetermined frequency output (such as 2 GHz). In one embodiment, the processor 106 may step through different oscillator settings (e.g., 10_001, 10_002, 10_003, discussed below) in order to determine which of the settings results in the output closest to the desired predetermined frequency output (such as 2 GHz) when the oscillator is at the predetermined temperature (such as 27° C.).

Communication interface 114 may comprise circuitry in order for the calibration device 102 to communicate with the electronic device 120. Further, an actual temperature may be determined in one of several ways. In one embodiment, a temperature sensor, separate from the temperature sensor resident on the electronic device, is used to determine the actual temperature. For example, FIG. 1A illustrates calibration device temperature sensor 112, which may be a temperature sensor that is separate from temperature sensor 136 and has been previously calibrated (e.g., generates an output indicative of the actual current temperature of the electronic device). As discussed in more detail below, during calibration, the output of the temperature sensor 136 may be compared with the output of the calibration device temperature sensor 112 in order to determine the temperature sensor correction factor 142. In an alternate embodiment, the actual temperature may be determined by another device, such as processor 106. For example, processor 106 may instruct heater 104 to heat the environment to a predetermined temperature. In instances where heater 104 is of sufficient accuracy, after providing sufficient time for the heater to heat to the instructed temperature, the processor may determine that the temperature of the electronic device is at the instructed temperature.

Electronic device 120 may communicate with calibration device 102 via mating parts 116, 118 of a mechanical and electrical connector. Electronic device 120 may comprise any type of device that is configured to use a temperature sensor and an oscillator. As merely one example, electronic device 120 may comprise a memory device. The memory device may be flash memory embedded within a host system, such as in the form of a solid state disk (SSD) drive installed in a personal computer. Alternatively, the memory device may be in the form of a card that is removably connected to the host system through mating parts 116 and 118. A flash memory configured for use as an internal or embedded SSD drive may be internal to the host system. SSD drives may be in the form of discrete modules that are drop-in replacements for rotating magnetic disk drives.

Further, in one embodiment, the memory, such as the flash memory, may comprise two-dimensional memory. In an alternate embodiment, the memory may comprise three-dimensional memory. In still an alternate embodiment, the memory may comprise a combination of two-dimensional memory and three-dimensional memory.

The electronic device 120 of FIG. 1A may include a controller 122, which may comprise a processor 124 and a memory 126. The controller 122 may include one or more general processors, controllers, application specific integrated circuits, field programmable gate arrays, digital circuits, optical circuits, analog circuits, combinations thereof, or other now known or later-developed devices for analyzing and processing data. The memory 126 may comprise volatile and/or non-volatile memory.

Memory 126 may include instructions 128, which may be accessed and executed by processor 124 in order for the electronic device 120 to include the functionality described herein. For example, instructions 128 may include communication with calibration device instructions 130, execution of which is used to enable the electronic device 120 to communicate with the calibration device 102. As another example, instructions 128 may include temperature sensor and oscillator readings for calibration instructions 134, execution of which is used to enable the electronic device 120 to work in combination with calibration device 102 to calibrate the temperature sensor 136 and oscillator 138.

More specifically, calibration control and correction factor determination instructions 110 executed by processor 106 of calibration device 102 may send commands to electronic device for the electronic device to obtain readings from the temperature sensor. The processor 124, executing temperature sensor and oscillator readings for calibration instructions 134, may obtain readings from the temperature sensor and the oscillator to determine the sensed temperature reading from temperature sensor 136, and the frequency output from oscillator 138, respectively, and may send the readings to the calibration device 102. In response to receiving the readings, the calibration control and correction factor determination instructions 110, executed by processor 106, may determine the temperature sensor correction factor and the oscillator correction factor, and may send the temperature sensor correction factor 142 and the oscillator correction factor 144 to the electronic device 120. The electronic device may store the temperature sensor correction factor 142 and the oscillator correction factor 144 in memory 140.

Memory 140 may be an example of a semiconductor memory device. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

As still another example, instructions 128 may include oscillator and temperature sensor control instructions 132, execution of which is used to enable the electronic device 120 to access and control the oscillator and temperature sensor during non-calibration operation (such as during normal operation). The processor 124, executing oscillator and temperature sensor control instructions 132, may access the temperature sensor correction factor 142 and oscillator correction factor 144 in order to apply the correction factors to the temperature sensor 136 and the oscillator 138, respectively.

Temperature sensor correction factor 142 may be represented in one of several ways. In one embodiment, temperature sensor correction factor 142 may be represented as a look-up table, correlating outputs as generated by temperature sensor 136 to adjust temperature sensor outputs. In an alternate embodiment, temperature sensor correction factor 142 may be represented as an equation, such as $y_{TS}=m_{TS}x_{TS}+B_{TS}$, as discussed above.

Likewise, oscillator correction factor 144 may be represented in one of several ways. In one embodiment, oscillator correction factor 144 may be represented as a look-up table, correlating desired frequencies as generated by temperature sensor 136 to adjusted temperature sensor outputs. In an alternate embodiment, temperature sensor correction factor 142 may be represented as an equation, such as $y_{OSC}=m_{OSC}x_{OSC}+B_{OSC}$, as discussed above.

In one embodiment, multiple memories may be present in electronic device 120, such as illustrated in FIG. 1A (memory 126 and memory 140). More specifically, memory 126 may be contained within controller 122 and memory 140 may be separate from controller 122 (such as an e-Fuse). In an alternate embodiment, a single memory may be used for electronic device 120. The temperature sensor correction factor 142 and/or the oscillator correction factor 144 may be stored in any one of the memories in the electronic device 120, such as in memory 140, as illustrated in FIG. 1A.

FIG. 1B illustrates a second example of a system 150 for calibrating the temperature sensor 136 and the oscillator 138 in an electronic device 154. In this example, the electronic device 154 includes the functionality to perform all of the calibration, including calibration control and correction factor determination instructions 158 and temperature sensor and oscillator readings for calibration instructions 134. Similar to calibration control and correction factor determination instructions 110 illustrated in FIG. 1A, calibration control and correction factor determination instructions 158 enables the processor 124 to send a command to the oscillator 138 to configure the oscillator 138 to a predetermined setting (such as 10_000, discussed below), enables the processor 124 to control heater 104, to access external temperature sensor 152 and enables the processor 124 to calculate the correction factors. In this regard, electronic device 154 need not rely on an external calibration device in order to perform the calibration. Further, in one embodiment, the processor 124 may further be configured to control the oscillator 138 to step through various settings in order to determine the setting of the oscillator that generates an output of a predetermined frequency.

FIG. 1C illustrates a third example of a system 170 for calibrating the temperature sensor 136 and the oscillator 138 in an electronic device 174 using a calibration device 172. In this example, the electronic device 154 includes the functionality to perform all of the calibration, including calibration control and correction factor determination instructions 158 and temperature sensor and oscillator readings for calibration instructions 134. Similar to calibration control and correction factor determination instructions 110 illustrated in FIG. 1A, calibration control and correction factor determination instructions 158 enables the processor 124 to control heater 104, to access external temperature sensor 152 and to calculate the correction factors. In this regard, electronic device 154 need not rely on an external calibration device in order to perform the calibration.

Figure 2:
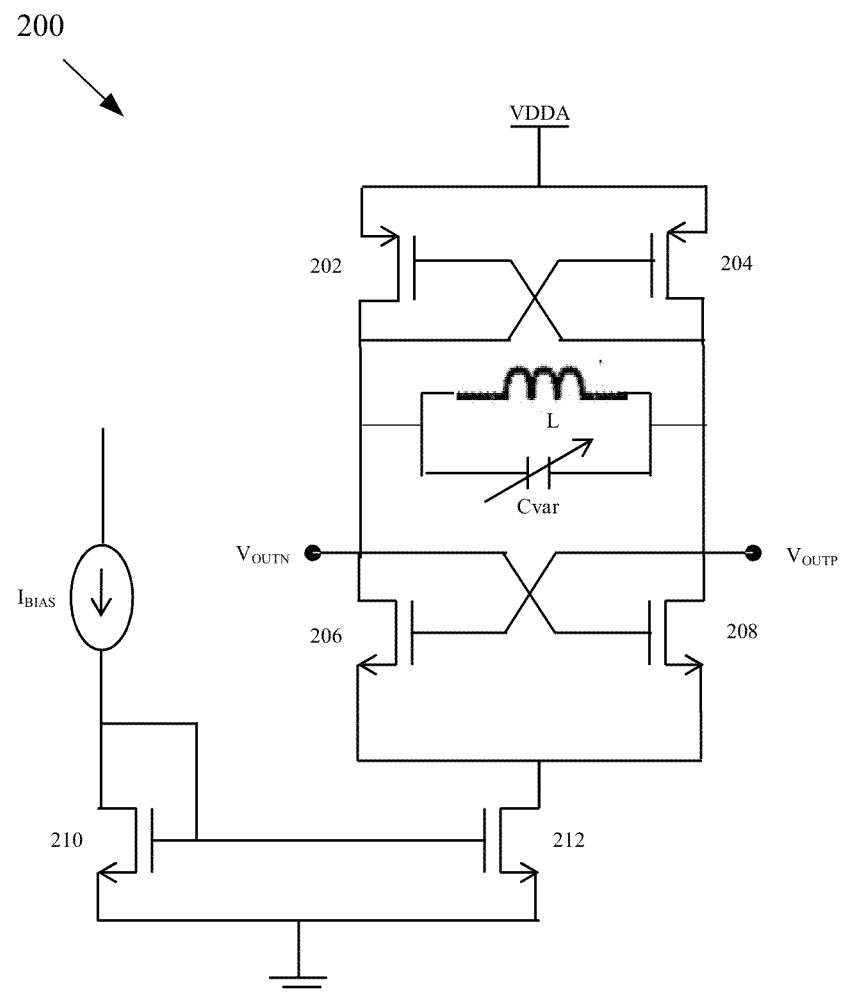
FIG. 2 illustrates a schematic of an exemplary LC oscillator circuit.

FIG. 2 illustrates a schematic of an exemplary LC oscillator circuit 200. As discussed above, various types of oscillators are contemplated, including capacitor-based oscillators such as LC oscillator circuit 200. LC oscillator circuit 200 includes a current source that generates a bias current ($I_{BIAS}$). $I_{BIAS}$ is sent to a current mirror, so $I_{BIAS}$ that flows through both transistor 210 and transistor 212. The LC oscillator circuit 200 further includes inductor L and variable capacitor Cvar. Transistors 202, 204, 206, and 208 are to configure the LC oscillator circuit 200 so that the output of the oscillator is at nodes $V_{OUTN}$ and $V_{OUTP}$. As discussed in more detail below, Cvar may include different values, such as illustrated in FIG. 3.

Figure 3:
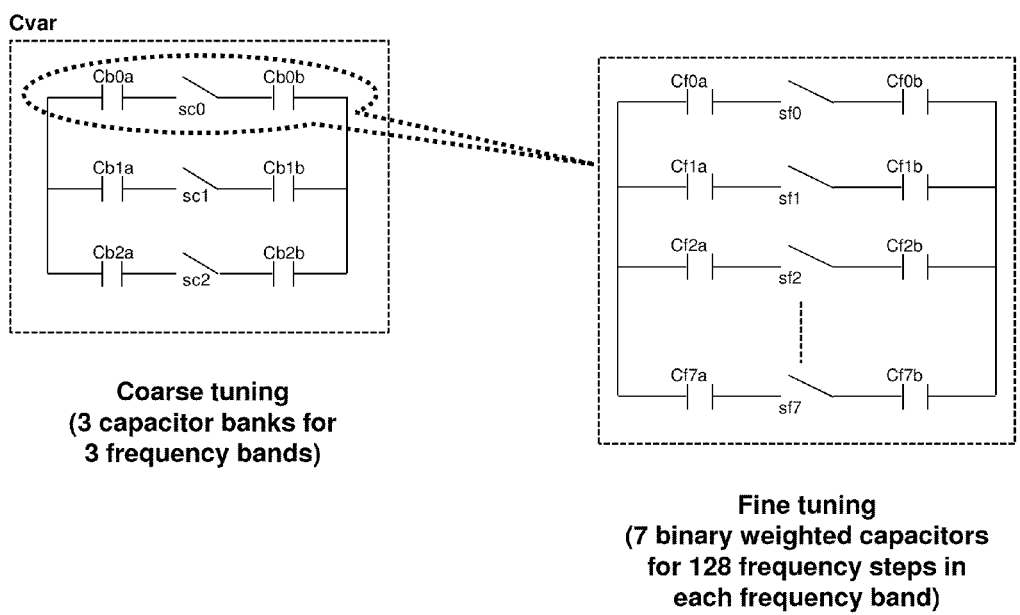
FIG. 3 illustrates an example of capacitor programming in the exemplary LC oscillator circuit of FIG. 2.

FIG. 3 illustrates an example of capacitor programming in the exemplary LC oscillator circuit 200 of FIG. 2. Cvar may include multiple values of the variable capacitor. In one example, Cvar may be composed of coarse-tuned capacitor settings and fine-tuned capacitor settings. For example, FIG. 3 illustrates three coarse-tuned settings and within each of the three coarse-tuned settings, 128 fine-tuned capacitor settings. More specifically, the fine-tuned capacitor settings include 7 binary weight capacitors for 128 frequency steps in each frequency band. FIG. 3 is merely for illustration purposes. Other variable capacitor configurations are contemplated. In this regard, the setting of the variable capacitor may be based on different binary values. For example, xx_xxxxxx, where x may be equal to 0 or 1.

Figure 4:
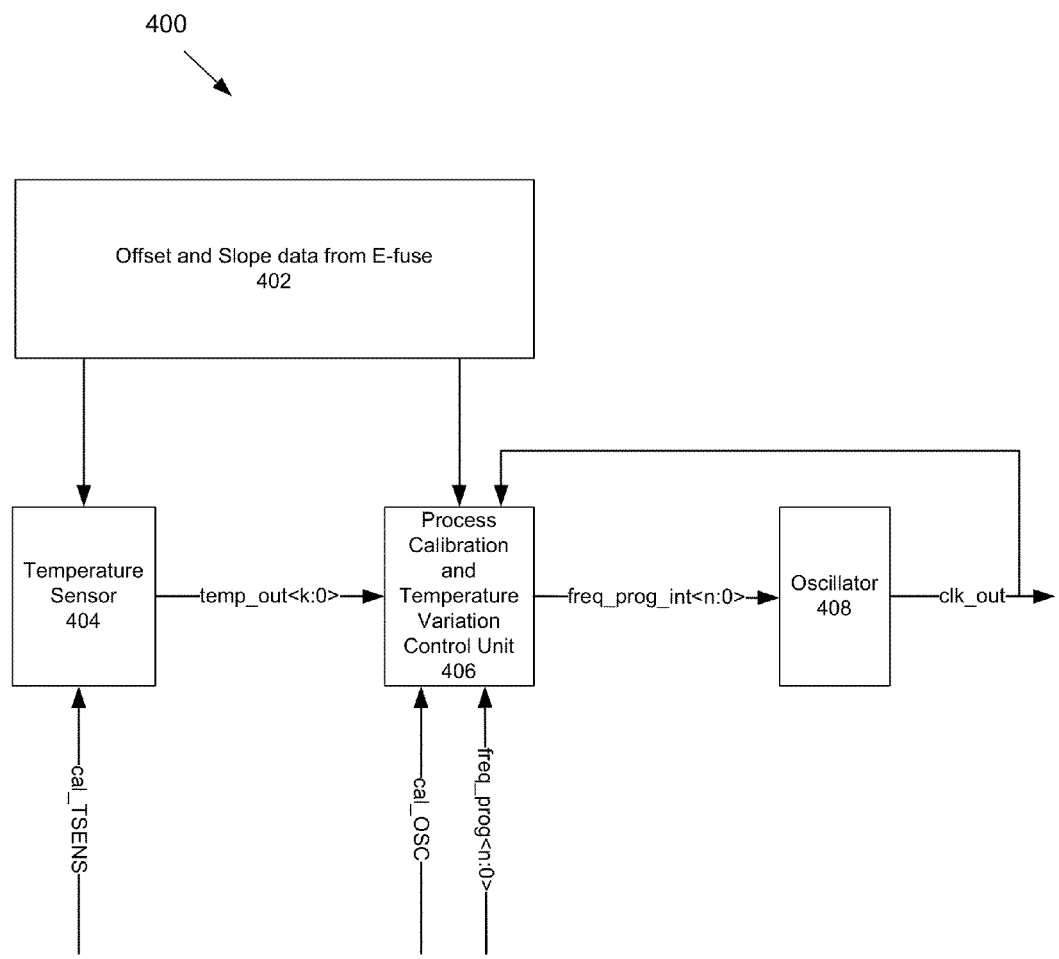
FIG. 4 illustrates a block diagram of one example of calibration of the temperature sensor and the oscillator.

FIG. 4 illustrates a block diagram 400 of one example of calibration of the temperature sensor 404 and the oscillator 408. In one embodiment, the temperature sensor 404 includes an analog-to-digital converter (ADC) so that the temperature sensor 404 outputs a digital output. The temperature sensor 404 may be configured to change linearly with increasing temperature, so that the temperature sensor correction factor may likewise be linear.

When calibration is desired, one or more signals may be generated. For example, cal_TSENS may be set to logic HIGH when it is desired to calibrate the temperature sensor 404. As another example, cal_OSC may be set to logic HIGH when it is desired to calibrate the oscillator 408. In one embodiment, cal_TSENS and cal_OSC are simultaneously set to logic HIGH in order to calibrate the temperature sensor 404 and the oscillator 408 simultaneously.

The process calibration and temperature variation control unit 406 is configured to perform two functions: (1) control the heater in order for the device to be at a predetermined temperature; and (2) calculate the temperature sensor correction factor and the oscillator correction factor.

In this regard, the following may representations may be used:

"freq_prog_int<n:0>"="freq_prog<n:0>"; when "cal_LCOSC" is logic "HIGH"

"freq_prog_int<n:0>"=function ("freq_prog<n:0>", "temp_out<k:0>"); when "cal_LCOSC" is logic "LOW"

where freq_prog<n:0> is the default setting of the oscillator. As discussed above, the variable capacitor may have a setting defined by multiple numbers. One example is xx_xxx in which the first two numbers are for the coarse tuning and the last three numbers are for the fine tuning. In one example, a setting of 00_000 will result in the lowest frequency output from the oscillator and a setting of 11_111 will result in the highest frequency output from the oscillator. When calibrating the oscillator, a single setting (or multiple settings) may be used. When calibrating using a single setting, a setting around (or at) the midpoint oscillator setting (such as 10_000 or 01_111) may be used. In this regard, "freq_prog<n:0>" may be set to the single setting.

After calibration, the temperature sensor correction factor and the oscillator correction factor may be stored. For example, the offset and the slope data for both the temperature sensor and the oscillator may be stored in an E-fuse. During operation of the electronic device, the offset and slope data from the E-fuse may be provided to both the temperature sensor 404 and to the process calibration and temperature variation control unit 406. The correction factor (such as the temperature sensor correction factor) from the E-fuse 402 may be provided to temperature sensor 404 in order to calibrate temperature sensor 404.

Figure 5:
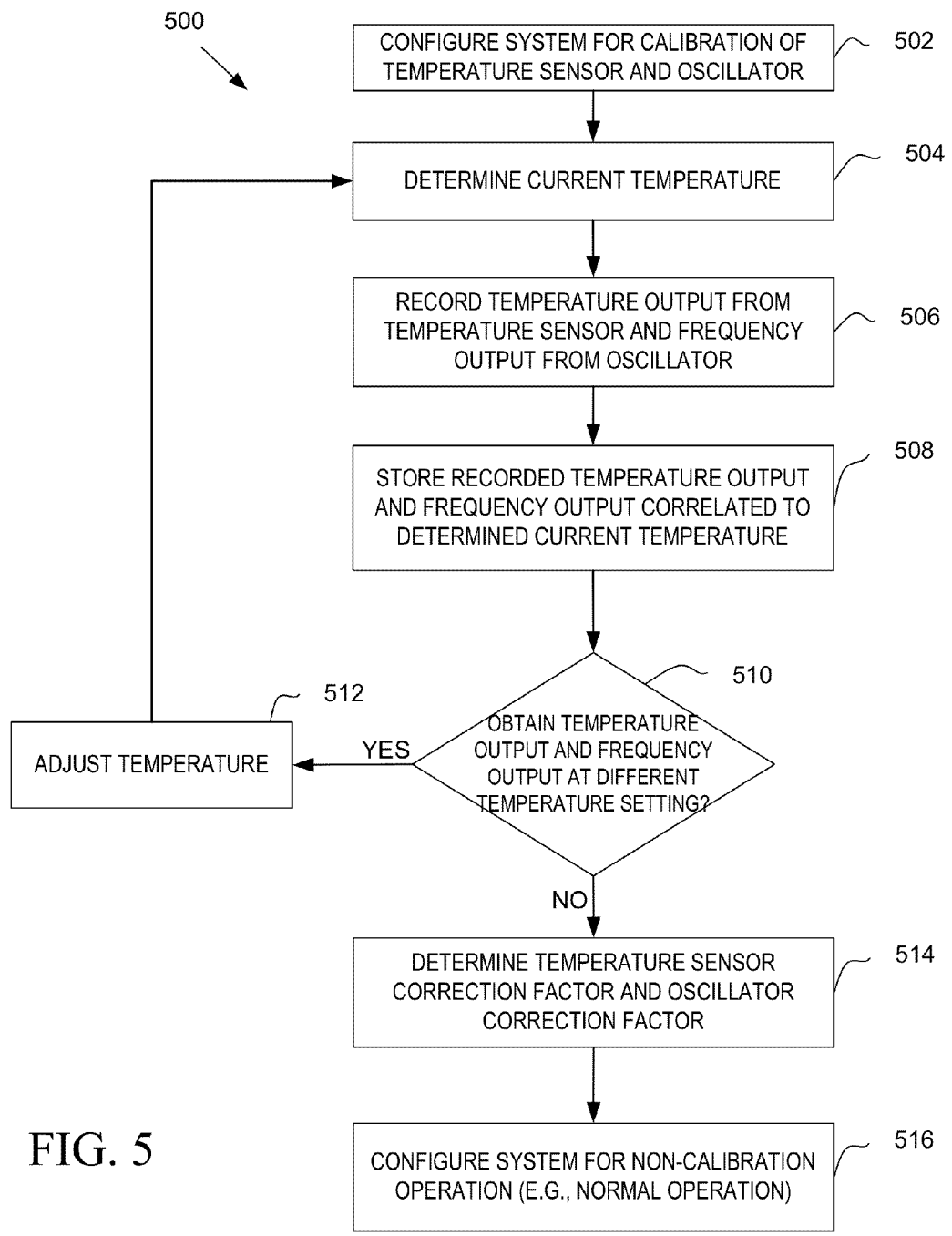
FIG. 5 illustrates a flow chart for calibrating the temperature sensor and the oscillator to generate a temperature sensor correction factor and an oscillator correction factor.

FIG. 5 illustrates a flow chart 500 for calibrating the temperature sensor and the oscillator to generate a temperature sensor correction factor and an oscillator correction factor. At 502, the system is configured for calibration of the temperature sensor and the oscillator. For example, one or more logic signals, such as cal_TSENS and cal_OSC, may be set to logic HIGH to indicate that the electronic device is undergoing calibration.

At 504, the current temperature is determined. As discussed above, the current temperature may be determined using a previously calibrated temperature sensor, such as calibration device temperature sensor 112 or external temperature sensor 152. At 506, the temperature output from the temperature sensor and the frequency output from the oscillator may be recorded. For example, the digital output from temperature sensor 404 may be recorded. Similarly, the output from the oscillator is sensed in order to determine the frequency output. As discussed above, the frequency (or freq_prog) at which the oscillator is set during calibration may be the same for both temperatures (such as at 27° C. and 90° C.). Further, the frequency may be at a midpoint of the settings of the oscillator. For example, in 7-bit trimming, the frequency may be set at 011_1111.

At 508, the recorded temperature output and the frequency output are stored correlated to the determined current temperature. At 510, it is determined whether to obtain the temperature output and the frequency output at a different temperature setting. For example, the temperature output and the frequency output may be obtained at two or more distinct temperatures, such as 27° C. and 90° C. In the first iteration, the temperature may be set to 27° C. After which, the temperature may be changed to 90° C.

If a different temperature setting is desired, at 512, the temperature is adjusted (e.g., such as by sending a command to the heater), and the flow chart 500 loops back to 504. If not, at 514, the temperature sensor correction factor and the oscillator correction factor are determined. As discussed above, the recorded temperature output and the frequency output correlated to different determined temperatures may be used to generate the temperature sensor correction factor and the oscillator correction factor, such as the slope $m_{TS}$, the y-intersect $B_{TS}$, slope $m_{OSC}$, the y-intersect $B_{OSC}$ discussed above.

At 516, the system is configured for non-calibration operation (such as normal operation). For example, one or more logic signals, such as cal_TSENS and cal_OSC, may be set to logic LOW to indicate that the electronic device is in normal operation.

Figure 6A:
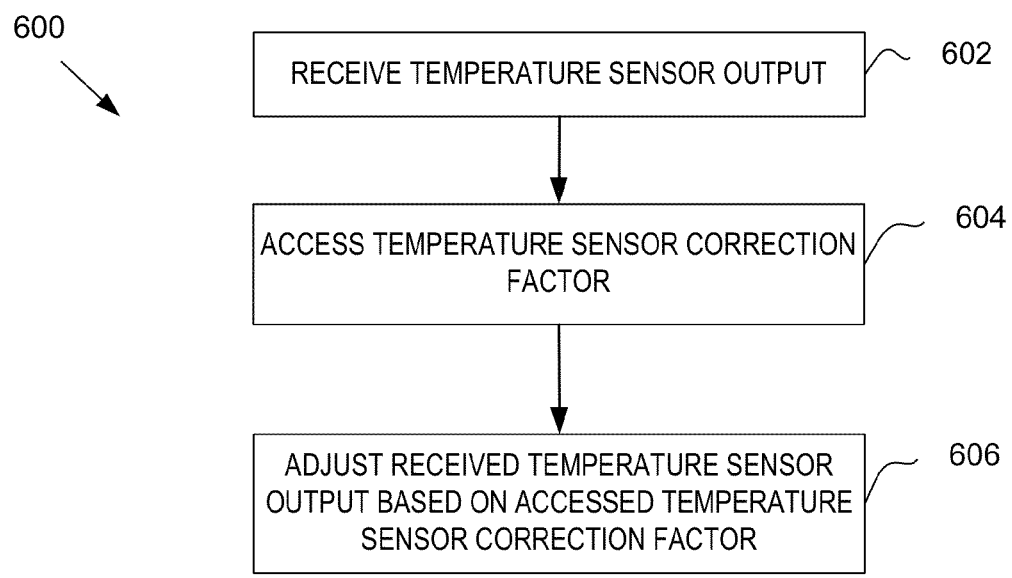
FIG. 6A illustrates a flow chart for applying the temperature sensor correction factor during normal operation.

FIG. 6A illustrates a flow chart 600 for applying the temperature sensor correction factor during normal operation. At 602, the temperature sensor output is received. At 604, the temperature sensor correction factor is accessed. At 606, the received temperature sensor output is adjusted based on the accessed temperature sensor correction factor.

Figure 6B:
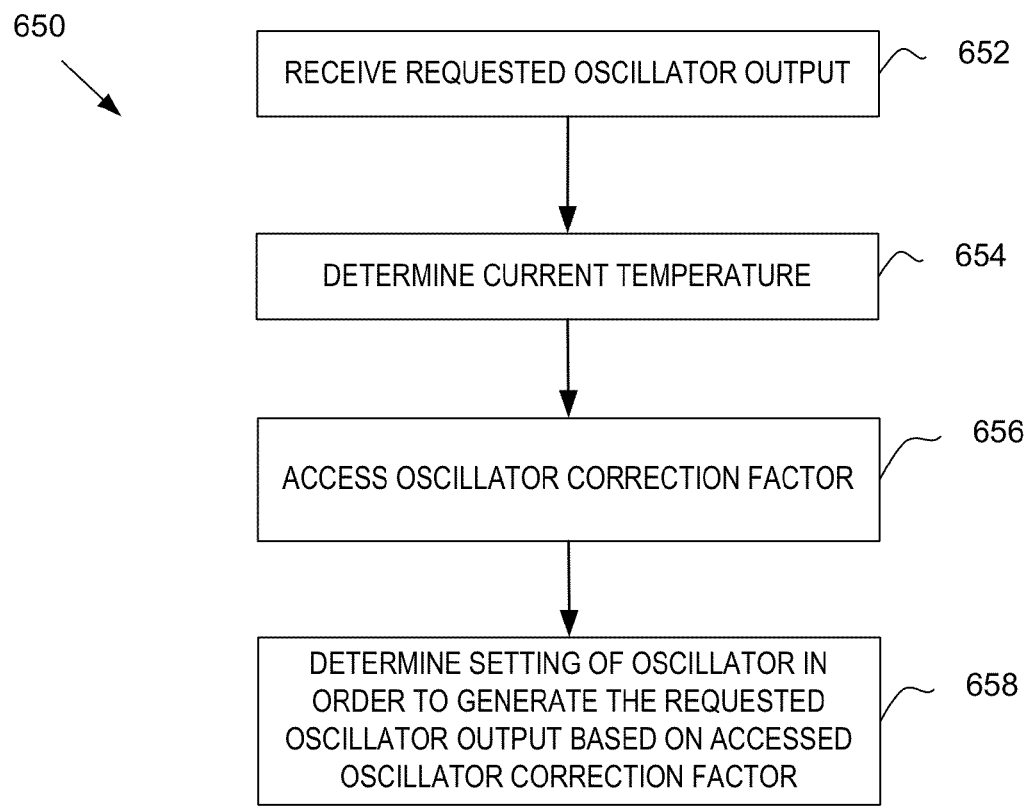
FIG. 6B illustrates a flow chart for applying the oscillator correction factor during normal operation.

FIG. 6B illustrates a flow chart 650 for applying the oscillator correction factor during normal operation. At 652, the oscillator output is received. The oscillator output may take one of several forms. One form is a specific desired frequency, such as 2 GHz. Other forms of oscillator output are contemplated. Further, the oscillator output may be received in one of several ways. One way is to access a memory location that stores the desired frequency. Another way is to dynamically receive the desired frequency, such as from an external electronic device.

At 654, the current temperature may be determined. In one embodiment, the temperature sensor on the electronic device, such as temperature sensor 136, may be accessed to obtain its output. The output of the temperature sensor may be adjusted based on the temperature sensor correction factor, such as discussed with regard to FIG. 6A in order to obtain the current temperature.

Figure 7:
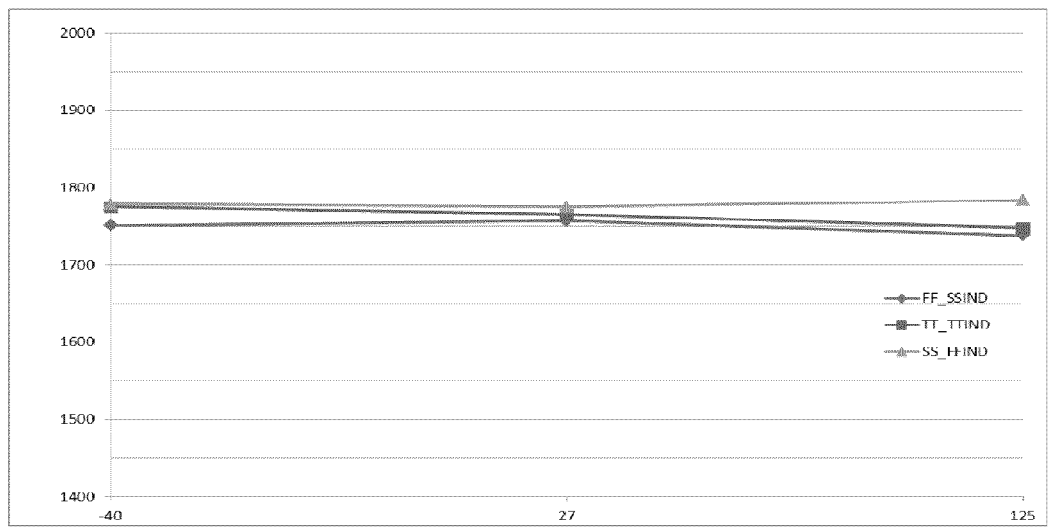
FIG. 7 illustrates frequency variation for the oscillator across process and temperature after calibration.

At 656, the oscillator correction factor is accessed. As discussed above, the oscillator correction factor may be dependent on the current temperature. In this regard, the current temperature (such as the output of the temperature sensor adjusted based on the correction factor) may be used as an input for the oscillator correction factor. Examples of oscillator correction factors are illustrated in FIG. 7, discussed below. More specifically, at a given current temperature, the oscillator correction factor may generate the output of the oscillator at a predetermined setting. For example, when an oscillator is calibrated at a specific oscillator setting, such as 10_000, discussed above, the oscillator correction factor may output the frequency that is generated by the oscillator at the given current temperature. The frequency generated at a current temperature of 15° C. may be, for example, 1750 MHz at a setting of 10_000.

Because the accessed oscillator correction factor may result in a frequency that is different from the desired frequency, an additional correction may be used. In one example, the frequency generated at a current temperature of 15° C. may be 1750 MHz at a setting of 10_000 and the desired frequency is 2 GHz. In this regard, an additional correction may be used in order to determine the oscillator setting, at the current temperature, that will result in an output at the desired frequency. For example, at 658, the oscillator correction factor is used to determine the setting of the oscillator that will generate the requested oscillator output at the current temperature.

In the example given above, the requested oscillator output may be 2 GHz. At a current temperature of 15° C., the oscillator correction factor determines that the oscillator generates a frequency of 1750 MHz at 10_000. Thus, the setting of the oscillator (e.g., xx_xxx) is determined using the oscillator correction factor and second correction factor. The second correction factor enables the determination of the oscillator setting to achieve the requested oscillator output.

The second correction factor may take one of several forms. In one form, the second correction factor may comprise the oscillator setting, at a certain temperature, to generate the requested oscillator output. For example, if the requested oscillator output is 2 GHz, at a certain temperature (such as 27° C.), the oscillator may be analyzed to determine the oscillator setting an oscillator output at 2 GHz. In this regard, the oscillator setting at the certain temperature that results in the desired frequency may then be used to determine the oscillator setting at the current temperature in order to achieve the desired frequency.

In another form, the second correction factor may comprise a frequency step between different oscillator settings. For example, the frequency step between oscillator settings may comprise 15 MHz (e.g., from setting 10_000 to 10_001 is 15 MHz; from setting 01_110 to 01_111 is 15 MHz). As another example, the frequency step between the oscillator settings may be variable depending on the oscillator settings (e.g., from setting 00_000 to 00_001 is 15 MHz; from setting 01_000 to 01_001 is 20 MHz; from setting 10_000 to 10_001 is 25 MHz; and from setting 11_000 to 11_001 is 30 MHz).

In the example given where the oscillator correction factor determines that at 15° C., the oscillator generates a frequency of 1750 MHz at 10_000 and the desired frequency is 2 GHz, the difference between the two frequencies may be determined (250 MHz) and then the frequency step (e.g., 25 MHz) may then be used to determine the number of adjustments (10 steps) so that the frequency setting may be selected at 11_010. The example given is merely for illustrative purposes. Other examples are contemplated.

The absolute frequency at different temperatures may vary across process corners (e.g., fast-fast, typical-typical, slow-slow). In some instances, the LC oscillator may have +/−12% frequency variation at 27° C. across process corners and +/−2.6% variation across temperature in typical corner. Calibration, as discussed herein, may reduce variation. For example, FIG. 7 illustrates frequency variation for the oscillator across process and temperature after calibration. FIG. 7 illustrates that using the calibration discussed herein, frequency variation of LC oscillator may be reduced, such as from +/−12% to +/−0.5% at 27° C. across process corners and from +/−2.6% to +/−0.75% variation across temperature in typical corner.

The present disclosure describes various functions, which may be implemented in hardware, in software, or in a combination of hardware and software. In one embodiment, the functions may be implemented using one or more sets of instructions, e.g. software, which may be embedded. Further, the instructions may perform one or more of the methods or logic as described herein, such as illustrated in FIGS. 5 and 6A-B. The instructions may reside in various parts of the system. For example, the instructions may reside in the electronic device or the calibration device (see FIGS. 1A-C and 4).

The instructions may be embodied in a computer-readable medium. The computer-readable medium may be a single medium, or the computer-readable medium may be a single medium or multiple media, such as a centralized or distributed database, and/or associated caches and servers that store one or more sets of instructions. The term "computer-readable medium" may also include any medium that may be capable of storing, encoding or carrying a set of instructions for execution by a processor or that may cause a computer system to perform any one or more of the methods or operations disclosed herein.

The computer-readable medium may include a solid-state memory such as a memory card or other package that houses one or more non-volatile read-only memories. The computer-readable medium also may be a random access memory or other volatile re-writable memory. Additionally, the computer-readable medium may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that may be a tangible storage medium. The computer-readable medium is preferably a tangible storage medium. Accordingly, the disclosure may be considered to include any one or more of a computer-readable medium or a distribution medium and other equivalents and successor media, in which data or instructions may be stored.

Alternatively or in addition, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system may encompass software, firmware, and hardware implementations.

The illustrations described herein are intended to provide a general understanding of the structure of various embodiments. The illustrations are not intended to serve as a complete description of all of the elements and features of apparatus, processors, and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

What is claimed is:

1. A method for obtaining temperature sensor output from a temperature sensor and oscillator output from an oscillator in a same temperature cycle in order to calibrate the temperature sensor and the oscillator in an electronic device, the electronic device comprising a memory, the method comprising:
sending a command in order to configure the oscillator to a predetermined frequency;
determining a first temperature of the electronic device;
while the electronic device is at the first temperature in the same temperature cycle:
receiving a first output of the temperature sensor indicative of the temperature sensor sensing the electronic device at the first temperature;
sensing a first output of the oscillator indicative of the oscillator generating a first frequency output at the first temperature;
controlling temperature of the electronic device so that the electronic device is at a second temperature in the same temperature cycle, the second temperature distinct from the first temperature;
while the temperature of the electronic device is being controlled at the second temperature in the same temperature cycle:
receiving a second output of the temperature sensor indicative of the temperature sensor sensing the electronic device at the second temperature;
sensing a second output of the oscillator indicative of the oscillator generating a second frequency output at the second temperature;
determining a temperature sensor correction factor based on the first output of the temperature sensor, the second output of the temperature sensor, the determined first temperature and the determined second temperature; and
determining an oscillator correction factor based on the first output of the oscillator, the second output of the oscillator, the determined first temperature, the determined second temperature and the predetermined frequency,
wherein the memory comprises a silicon substrate and a plurality of memory cells forming at least two memory layers vertically disposed with respect to each other to form a monolithic three-dimensional structure, wherein at least one memory layer is vertically disposed with respect to the silicon substrate.

2. The method of claim 1, wherein the temperature sensor correction factor comprises a first line; and
wherein the oscillator correction factor comprises a second line.

3. The method of claim 1, wherein the oscillator comprises a capacitor-based oscillator.

4. The method of claim 1, wherein the first temperature comprises an ambient temperature; and
wherein the second temperature comprises a temperature greater than ambient temperature.

5. The method of claim 4, wherein controlling temperature of the electronic device so that the electronic device is at the second temperature in the same temperature cycle comprises heating the electronic device to the second temperature.

6. The method of claim 1, wherein the first temperature comprises a first heated temperature; and
wherein the second temperature comprises a second heated temperature greater than the first heated temperature.

7. The method of claim 1, wherein determining the first temperature of the electronic device comprises using an external temperature sensor.

8. The method of claim 1, wherein a calibration device, separate from the electronic device, determines the temperature sensor correction factor and determines the oscillator correction factor.

9. The method of claim 1, wherein the electronic device is configured to determine the temperature sensor correction factor and determine the oscillator correction factor.

10. The method of claim 1, wherein the oscillator is configured to operate at a predetermined frequency;
wherein the oscillator includes a plurality of settings, each of the plurality of settings resulting in different outputs of the oscillator; and
further comprising determining a setting, from the plurality of settings, at which the oscillator operates at the predetermined frequency when the oscillator is at the first predetermined temperature.

11. The method of claim 1, wherein the electronic device further comprises a controller; and
wherein the controller is on the same substrate as the memory cells.

12. A device configured to obtain temperature sensor output from a temperature sensor and oscillator output from an oscillator in a same temperature cycle in order to calibrate the temperature sensor and the oscillator in an electronic device, the device comprising:
a memory;
an interface configured to communicate with the oscillator and the temperature sensor; and
a controller in communication with the memory and the interface, and configured to:
send a command in order to configure the oscillator to a predetermined frequency;
determine a first temperature of the electronic device;
while the electronic device is at the first temperature in the same temperature cycle:
receive a first output of the temperature sensor indicative of the temperature sensor sensing the electronic device at the first temperature;
sense a first output of the oscillator indicative of the oscillator generating a first frequency output at the first temperature;
control temperature of the electronic device so that the electronic device is at a second temperature in the same temperature cycle, the second temperature distinct from the first temperature;
while the temperature of the electronic device is being controlled at the second temperature in the same temperature cycle:
receive a second output of the temperature sensor indicative of the temperature sensor sensing the electronic device at the second temperature;
sense a second output of the oscillator indicative of the oscillator generating a second frequency output at the second temperature;
determine a temperature sensor correction factor based on the first output of the temperature sensor, the second output of the temperature sensor, the determined first temperature and the determined second temperature; and determine an oscillator correction factor based on the first output of the oscillator, the second output of the oscillator, the determined first temperature, the determined second temperature and the predetermined frequency, wherein the memory comprises a silicon substrate and a plurality of memory cells forming at least two memory layers vertically disposed with respect to each other to form a monolithic three-dimensional structure, wherein at least one memory layer is vertically disposed with respect to the silicon substrate.

13. The device of claim 12, wherein the temperature sensor correction factor comprises a first line; and wherein the oscillator correction factor comprises a second line.

14. The device of claim 12, wherein the oscillator comprises a capacitor-based oscillator.

15. The device of claim 12, wherein the first temperature comprises an ambient temperature; and wherein the second temperature comprises a temperature greater than ambient temperature.

16. The device of claim 15, wherein the controller is configured to control temperature of the electronic device so that the electronic device is at the second temperature in the same temperature cycle by heating the electronic device to the second temperature.

17. The device of claim 12, wherein the first temperature comprises a first heated temperature; and wherein the second temperature comprises a second heated temperature greater than the first heated temperature.

18. The device of claim 12, wherein the controller is configured to determine the first temperature of the electronic device by using an external temperature sensor.

19. The device of claim 12, wherein the device comprises a calibration device separate from the electronic device.

20. The device of claim 12, wherein the device comprises the electronic device.

21. The device of claim 12, wherein the oscillator is configured to operate at a predetermined frequency;

wherein the oscillator includes a plurality of settings, each of the plurality of settings resulting in different outputs of the oscillator; and wherein the controller is further configured to determine a setting, from the plurality of settings, at which the oscillator operates at the predetermined frequency when the oscillator is at the first predetermined temperature.

22. The device of claim 12, wherein the controller is on the same substrate as the memory cells.

* * * * *